(12) United States Patent
Pei et al.

(10) Patent No.: US 10,879,500 B2
(45) Date of Patent: Dec. 29, 2020

(54) ORGANIC ELECTROLUMINESCENT DEVICE AND FABRICATION METHOD THEREOF

(71) Applicant: Wuhan China Star Optoelectronics Semiconductor Display Technology Co., Ltd., Hubei (CN)

(72) Inventors: Lei Pei, Guangdong (CN); Mingming Chi, Guangdong (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 15/553,550

(22) PCT Filed: Jul. 14, 2017

(86) PCT No.: PCT/CN2017/092925
§ 371 (c)(1),
(2) Date: Aug. 24, 2017

(87) PCT Pub. No.: WO2019/000497
PCT Pub. Date: Jan. 3, 2019

(65) Prior Publication Data
US 2019/0006632 A1  Jan. 3, 2019

(30) Foreign Application Priority Data
Jun. 28, 2017 (CN) .......................... 2017 1 0509541

(51) Int. Cl.
*H01L 51/56* (2006.01)
*H01L 27/32* (2006.01)
*H01L 51/52* (2006.01)

(52) U.S. Cl.
CPC .......... *H01L 51/56* (2013.01); *H01L 27/3211* (2013.01); *H01L 27/3218* (2013.01); *H01L 51/5265* (2013.01)

(58) Field of Classification Search
CPC . H01L 51/56; H01L 51/5265; H01L 27/3218; H01L 27/3211
See application file for complete search history.

(56) References Cited

U.S. PATENT DOCUMENTS

2007/0178389 A1* 8/2007 Yoo .......................... G03F 1/70
430/5
2009/0309109 A1 12/2009 Chang et al.
(Continued)

FOREIGN PATENT DOCUMENTS

CN  101872845 A  10/2010
CN  103227294 A  7/2013
(Continued)

*Primary Examiner* — Vongsavanh Sengdara
(74) *Attorney, Agent, or Firm* — Leong C. Lei

(57) ABSTRACT

A fabrication method of an organic electroluminescent device includes: providing a substrate configured to an anode of the device; fabricating a blue pixel emission layer on one side of the substrate with a universal mask plate; and fabricating a red pixel emission layer and a green emission layer successively on one side of the blue pixel emission layer which backs toward the substrate. The blue pixel emission layer includes an effective emission area and a non-effective emission area. The red pixel emission layer and the green pixel emission layer both are the same layer and arranged on the non-effective emission area. The present disclosure can reduce equipment expenditure in fabricating the emission layers and the complexities of technology.

14 Claims, 2 Drawing Sheets

(56) References Cited

U.S. PATENT DOCUMENTS

| | | | | |
|---|---|---|---|---|
| 2014/0027732 A1* | 1/2014 | Pyo | ................... | H01L 51/5265 |
| | | | | 257/40 |
| 2014/0183471 A1* | 7/2014 | Heo | ................... | H01L 51/504 |
| | | | | 257/40 |
| 2015/0144926 A1* | 5/2015 | Lee | ................... | H01L 51/5044 |
| | | | | 257/40 |
| 2017/0141345 A1* | 5/2017 | Park | ................... | H01L 51/5265 |

FOREIGN PATENT DOCUMENTS

| | | |
|---|---|---|
| CN | 104466032 A | 3/2015 |
| CN | 104851980 A | 8/2015 |

\* cited by examiner

ORGANIC ELECTROLUMINESCENT DEVICE AND FABRICATION METHOD THEREOF

BACKGROUND

1. Field of the Disclosure

The present disclosure relates to the technical field of display, and more particularly, to an organic electroluminescent device and a fabrication method of the organic electroluminescent device.

2. Description of the Related Art

With advantages of spontaneous light emission, low driving voltage, highly effective illumination, short response time, etc., organic light-emitting diode (OLED) display devices are regarded as enormous potential for industrial development.

FIG. 1 is a schematic diagram of a conventional organic electroluminescent device. The organic electroluminescent device of the related art includes a substrate 102, a hole transport layer 103, an emission layer 101, an electron transport layer 104, and a metallic cathode layer 105. The emission layer 101 is formed by a red pixel emission layer (R), a green pixel emission layer (G), and a blue pixel emission layer (B). The red pixel emission layer (R), the green pixel emission layer (G), and the blue pixel emission layer (B) all are the same layer.

The applicant of the present disclosure has some observations from a long-term study. These observations are the complexities of the fabrication process of the emission layer as one part of the OLED device of the related art and high requirement for accuracy of equipment. Moreover, it is necessary to use an elaborate mask plate to fabricate the red pixel emission layer (R), the green pixel emission layer (G), and the blue pixel emission layer (B) correspondingly when these emission layers are evaporated, which needs a lot of equipment expenditure of fabrication of the emission layers and increases the complexities of technology.

SUMMARY

An object of the present disclosure is to propose an organic electroluminescent device and a fabrication method of the organic electroluminescent device to reduce equipment expenditure in fabricating the organic electroluminescent device and the complexities of technology.

According to one aspect of the present disclosure, A fabrication method of an organic electroluminescent device comprises: providing a substrate configured to an anode of the device; fabricating a blue pixel emission layer on one side of the substrate with a universal mask plate; material for the blue pixel emission layer comprising body material and a doping; the body material configured to transport holes; the doping comprising a chemical compound with a blue emission radical group; fabricating a red pixel microcavity adjustment layer and a green pixel microcavity adjustment layer successively on one side of the blue pixel emission layer which backs toward the substrate; fabricating a red pixel emission layer on one side of the red pixel microcavity adjustment layer which backs toward the blue pixel emission layer; fabricating a green pixel emission layer on one side of the green pixel microcavity adjustment layer which backs toward the blue pixel emission layer. The blue pixel emission layer comprises an effective emission area and a non-effective emission area. The red pixel emission layer and the green pixel emission layer both are the same layer and arranged on the non-effective emission area.

According to another aspect of the present disclosure, a fabrication method of an organic electroluminescent device includes: providing a substrate configured to an anode of the device; fabricating a blue pixel emission layer on one side of the substrate with a universal mask plate; and fabricating a red pixel emission layer and a green emission layer successively on one side of the blue pixel emission layer which backs toward the substrate. The blue pixel emission layer comprises an effective emission area and a non-effective emission area. The red pixel emission layer and the green pixel emission layer both are the same layer and arranged on the non-effective emission area.

According to still another aspect of the present disclosure, an organic electroluminescent device includes: a substrate, configured to be an anode of the device; a blue pixel emission layer, arranged on one side of the substrate and fabricated with a universal mask plate; a red pixel emission layer and a green pixel emission layer, both being arranged on one side of the blue pixel emission layer which backs toward the substrate and being the same layer. The blue pixel emission layer comprises an effective emission area and a non-effective emission area. The red pixel emission layer and the green pixel emission layer both are arranged on the non-effective emission area.

Compared with the related art, the organic electroluminescent device provided by the present disclosure includes a blue pixel emission layer including an effective emission area and a non-effective emission area. Moreover, the organic electroluminescent device provided by the present disclosure includes a red pixel emission layer and a green pixel emission layer both arranged on one side of the blue pixel emission layer which backs toward a substrate and both arranged on the non-effective emission area. With the premise that the organic electroluminescent device displays normally, the blue pixel emission layer is fabricated with a universal mask plate in an embodiment of the present disclosure.

DETAILED DESCRIPTION OF THE EMBODIMENTS

Figure 1:
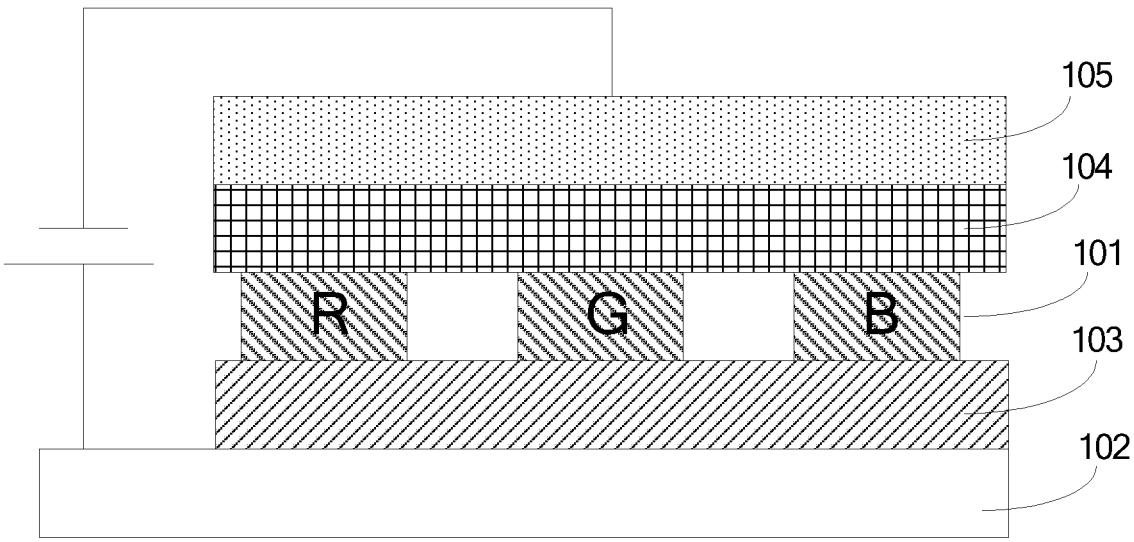
FIG. 1 is a schematic diagram of a conventional organic electroluminescent device.
Figure 2:
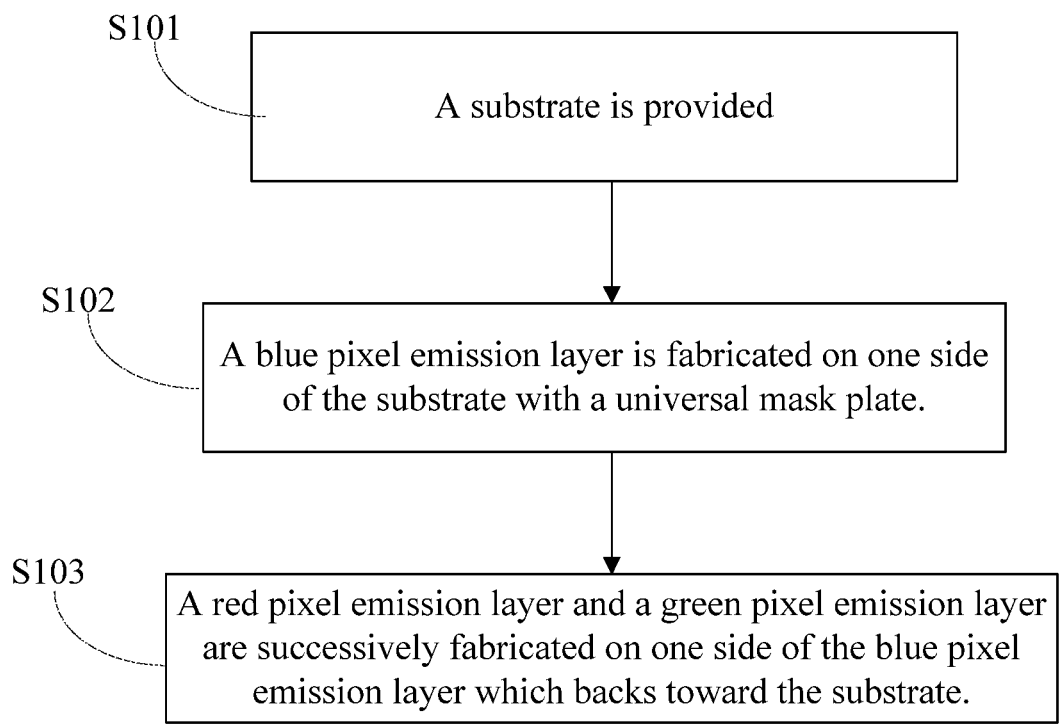
FIG. 2 is a flowchart of a fabrication method of an organic electroluminescent device according to an embodiment of the present disclosure.

FIG. 2 is a flow diagram of a fabrication method of an organic electroluminescent device according to an embodiment of the present disclosure. The method includes block S101, block S102, and block S103.

Figure 3:
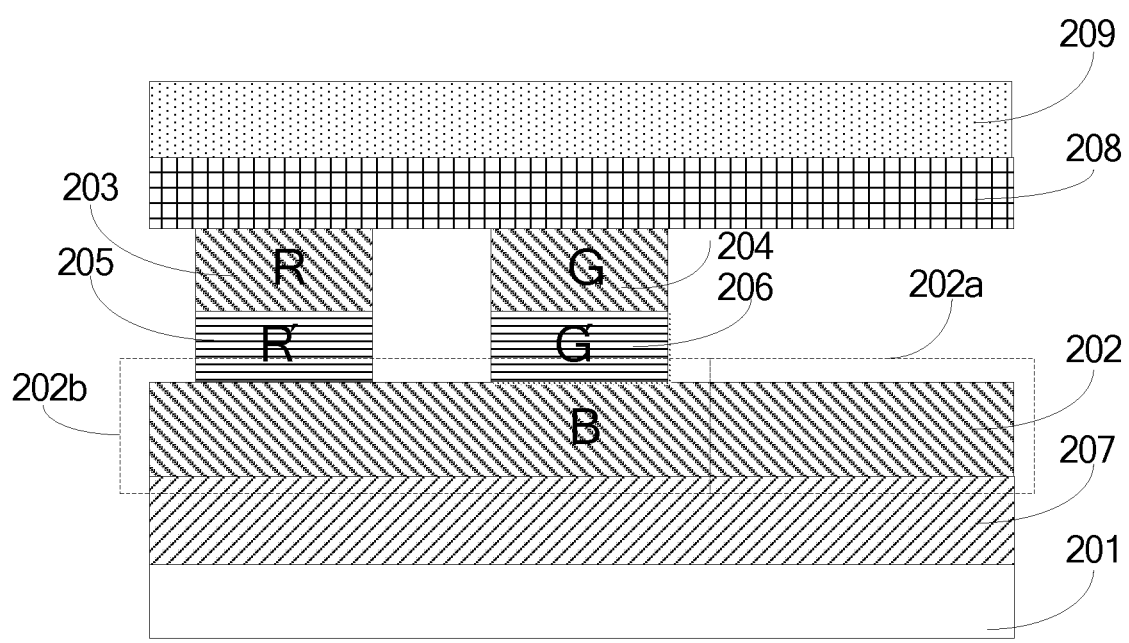
FIG. 3 is a schematic diagram of an organic electroluminescent device according to an embodiment of the present disclosure.

At block S101, a substrate is provided. Accompanied by FIG. 3, FIG. 3 is a schematic diagram of an organic electroluminescent device according to an embodiment of the present disclosure. A substrate 201 is configured to be an anode of the organic electroluminescent device. The property of material for the substrate 201 requires high work function and excellent transparency such as indium tin oxide (ITO), polyester thin film, and plastics.

At block S102, a blue pixel emission layer is fabricated on one side of the substrate with a universal mask plate. Accompanied by FIG. 3, material for the blue pixel emission layer 202 includes body material and a doping. The body material has a capacity of hole transport; that is, the hole mobility of the body material is greater than the electron mobility of the body material. In an application case, the body material may be poly-phenylene vinylene (PPv) and the like, polythiophene and the like, polysilane and the like, triphenylmethane and the like, triarylamine and the like, hydrazone and the like, pyrazoline and the like, chewazole and the like, carbazole and the like, and butadiene and the like. When the hole is injected, the orientation of the hole is transported in order on an external electric field. The doping includes a chemical compound with a blue emission radical group such as a chemical compound with a phenanthrene imidazole radical group. In another embodiment, the doping may be a mixture as well; that is, the doping includes a plurality of chemical compounds with a blue fluorescence emission radical group, which is not limited by the present disclosure. The blue pixel emission layer 202 is fabricated with a universal mask plate. Compared with an elaborate mask plate, a universal mask plate is cheaper, easy to keep clean, and hard to deform in operation, thereby reducing equipment expenditure in fabricating the emission layers and the complexities of technology. In addition, the elaborate mask plate in operation tends to be affected by negative effects such as color mixture and shadow; instead, the universal mask plate in operation is hardly affected by these negative effects.

At block S103, a red pixel emission layer and a green pixel emission layer are successively fabricated on one side of the blue pixel emission layer which backs toward the substrate. Accompanied by FIG. 3, the blue pixel emission layer 202 includes an effective emission area 202a and a non-effective emission area 202b. The effective emission area 202a indicates an area where a blue light is effectively emitted after an external electric field is driven. The effective emission area 202a overlaps the emission area of the blue-light pixel in the OLED device of the related art. The non-effective emission area 202b indicates an area where a blue light fails to emit after an external electric field is driven. The red pixel emission layer 203 and the green pixel emission layer 204 are arranged to be the same layer on the non-effective emission area 202b so as to ensure that the OLED device displays normally. The materials for the red pixel emission layer 203 and the green pixel emission layer 204 are the same as the materials for the red pixel emission layer and the green pixel emission layer of the related art.

To improve the efficiency of illumination of the organic electroluminescent device, further, a block before block S103 as introduced above includes fabricating a red pixel microcavity adjustment layer and a green pixel microcavity adjustment layer successively on one side of the blue pixel emission layer which backs toward a substrate. Block S103 includes fabricating the red pixel emission layer on one side of the red pixel microcavity adjustment layer which backs toward the blue pixel emission layer and fabricating the green pixel emission layer on one side of the green pixel microcavity adjustment layer which backs toward the blue pixel emission layer. Accompanied by FIG. 3, in an application case, the area of the red pixel microcavity adjustment layer 205 is the same as the area of the red pixel emission layer 203, and the area of the green pixel microcavity adjustment layer 206 is the same as the area of the green pixel emission layer 204, which can be designed otherwise in another embodiment. To improve the efficiency of illumination of an organic electroluminescent device, material for a red pixel microcavity adjustment layer 205 is the same as or different from material for a green pixel microcavity adjustment layer 206 in another embodiment. For example, N,N'-Di(1-naphthyl)-N,N'-diphenyl-1, 1'-biphenyl-4-4'-diamino, and a derivative of 1'-biphenyl-4-4'-diamino are adopted as the material to transport a hole and to block electron transport, thereby improving the efficiency of illumination. In an application case, when the light of a red pixel emission layer 203, the light of a green pixel emission layer 204, and the light of a blue pixel emission layer 202 are interwoven, a red light area, a green light area, and a blue light area, and a mixture area exist. Color shift easily occurs in the mixture area when the energy is not evenly distributed at a certain angle, especially a big angle, owing to the different light colors. However, the occurrence of color shift in the mixture area reduces if the thickness of the red pixel emission layer 203, the thickness of the green pixel emission layer 204, the thickness of the blue pixel emission layer 202, the thickness of the red pixel microcavity adjustment layer 205, and the thickness of the green pixel microcavity adjustment layer 206 are well designed. The present disclosure will not focus on the topic.

In another embodiment, further, a block before block S102 as introduced above includes fabricating a hole transport layer between the substrate and the blue pixel emission layer. Accompanied by FIG. 3, a hole transport layer 207 is configured to reinforce transportation of a hole in an organic electroluminescent device and block electrons for the best. Material for the hole transport layer 207 is PEDOT:PSS (poly(3,4-ethylenedioxythiophene):herochem), NPB (N,N'-Di(1-naphthyl)-N,N'-dipheny-1, 1'-biphenyl-4-4'-diamino), etc. In another embodiment, a hole transport layer 207 may be configured to transport holes only. Additionally, an electron block layer is arranged between the hole transport layer 207 and the blue pixel emission layer 202. In another embodiment, a hole injection layer is further arranged between a substrate 201 and a hole transport layer 207 to further improve the efficiency of an organic electroluminescent device. Material for the hole injection layer is the same as material for the hole injection layer of the related art.

In another embodiment, further, a block after the block S103 as introduced above includes successively fabricating an electron transport layer and a metallic cathode layer on one side of the red pixel emission layer and the green pixel emission layer which backs toward the substrate. Accompanied by FIG. 3, an electron transport layer 208 is configured to transport electrons and block a hole for the best so that the electrons can enter the emission layer effectively. The material of the electron transport layer 208 may be TPBi(1,3,5-tris(1-phenyl-1H-benzimidazol-2-yl)benzene) and Alq3(8-hydroxyquinolato)aluminum. In another embodiment, an electron transport layer 208 may be configured to transport electrons only. Additionally, a hole block layer is arranged between the electron transport layer 208 and a red pixel emission layer 203. The work function of a metallic cathode layer 209 is generally lower so the material of the metallic cathode layer 209 may be lithium fluoride (LiF)/aluminum (Al), magnesium (Mg), Silver (Ag), etc. In another embodiment, an electron injection layer is further arranged between a metallic cathode layer 209 and an electron transport layer 208 to further improve the efficiency of an organic electroluminescent device. Material for the electron injection layer is the same as material for the electron injection layer of the related art.

Accompanied by a concrete application case and FIG. 3, the present disclosure further elaborates a fabrication method of the organic electroluminescent device. The fabrication method includes block A, block B, block C, block D, block E, block F, block G, block H, block and I. At block A, a substrate 201 is provided. At block B, the substrate 201 is moved to a cavity, and an electron transport layer 207 is evaporated on the substrate 201 with a universal mask plate. At block C, the substrate 201 is moved to another cavity, and a blue pixel emission layer 202 is evaporated on the electron transport layer 207 with the universal mask plate. At block D, the substrate 201 is moved to another cavity, and a red pixel microcavity adjustment layer 205 and a green pixel microcavity adjustment layer 206 are successively evaporated on the blue pixel emission layer 202 with an elaborate mask plate. At block F, the substrate 201 is moved to another cavity, and a red pixel emission layer 203 is evaporated on the red pixel microcavity adjustment layer 205 with the elaborate mask plate. At block G, the substrate 201 is moved to another cavity, and a green pixel emission layer 204 is evaporated on a green pixel microcavity adjustment layer 206 with the elaborate mask plate. At block H, the substrate 201 is moved to another cavity, and an electron transport layer 208 is evaporated on the green pixel emission layer 204 with the universal mask plate. At block I, the substrate 201 is moved to another cavity, and a metallic cathode layer 209 is evaporated on the electron transport layer 208 with the universal mask plate. In sum, the blue pixel emission layer 202 is fabricated with the universal mask plate in the embodiment of the present disclosure. Compared with an elaborate mask plate, a universal mask plate is cheaper, easy to keep clean, and hard to deform in operation, thereby reducing equipment expenditure in fabricating the device and the complexities of technology.

FIG. 3 is a schematic diagram of the structure of an organic electroluminescent device according to another embodiment of the present disclosure. The above-mentioned embodiment has gone into detail about the features of each of the layers and structures of the device and the fabrication method of the device so the present embodiment refrains from repetition.

Two main methods of driving the organic electroluminescent device are passive matrix OLED (PMOLED) and active matrix OLED (AMOLED). The AMOLED includes pixels arranged in an array. As a type of active display with high luminous efficacy, the AMOLED gets a lot of attention from the industry. The driving principle of the AMOLED is to correspond to each thin-film transistor (TFT) to one OLED pixel using a TFT array. A TFT corresponding to the pixel is turned on so that a desired lit-up pixel for emission can be turned on for a consecutive predetermined period of time.

In another application case, a thin-film transistor (TFT) corresponding to a red pixel emission layer 203 is driven if the red pixel emission layer 203 needs to be lit up. A hole is transported to the red pixel emission layer 203 through a substrate 201, a hole transport layer 207, a blue pixel emission layer 202, and a red pixel microcavity adjustment layer 205. An electron is transported to the red pixel emission layer 203 through a metallic cathode layer 209 and an electron transport layer 208. The electron and the hole are encountered and compounded to be an exciton in the red pixel emission layer 203. The exciton is spread to transport the energy to the red pixel emission layer 203 so as to excite the electron of the material at a baseline state to be at an excited state in the red pixel emission layer 203. The excited state is unstable, and the energy is released as a photon when the electron at the excited state returns to the baseline state to further make the red pixel emission layer 203 emit light. Meanwhile, the blue pixel emission layer 202 does not emit light. On the other hand, most of the electrons produced by the metallic cathode layer 209 are blocked by the red pixel microcavity adjustment layer 205. Because the energy level of the lowest unoccupied molecular orbital (LUMO) of the red pixel microcavity adjustment layer 205 is higher than the energy level of the LUMO of the red pixel emission layer 203, the red pixel microcavity adjustment layer 205 blocks the electrons successfully. On the other hand, even if some of the electrons penetrate the red pixel microcavity adjustment layer 205, the blue pixel emission layer 202 blocks the electrons successfully for the second time because the energy level of the LUMO of the blue pixel emission layer 202 is higher than the energy level of the LUMO of the red pixel microcavity adjustment layer 205. At this time, the electrons transported to the blue pixel emission layer 202 can be omitted practically. In addition, the wavelength of the red light (about 700 nanometer (nm)) is greater than the wavelength of the green light (about 546.1 nm), and the wavelength of the green light is greater than the wavelength of the blue light (about 435.8 nm) so the energy necessary for exciting and producing the blue light is greater than the energy necessary for exciting and producing the green light and the red light. Therefore, even if the electrons are transported to the blue pixel emission layer 202 at this time, the energy necessary for exciting and producing the blue light is not adequate to excite the material of the blue pixel emission layer 202. As a result, the blue pixel emission layer 202 below the red pixel emission layer 203 does not emit light when the red pixel emission layer 203 is lit up.

In another application case, to light up a green pixel emission layer 204, a process similar to the process introduced in the above-mentioned embodiment can be adopted directly. The present embodiment does not go into detail. As a result, a blue pixel emission layer 202 does not emit light.

In another application case, an area driven by a thin-film transistor (TFT) corresponding to a desired lit-up blue pixel emission layer 202 is limited to the same area in an organic light-emitting diode (OLED) device of the related art, that is, an effective emission area 202a. Therefore, either a red pixel emission layer 203 or a green pixel emission layer 204 does not emit light while the effective emission area 202a of the blue pixel emission layer 202 emits light.

Therefore, according to the introduction above, the organic electroluminescent device provided by the present disclosure retains the circuit and the pattern layout of pixels of the OLED device of the related art. With the premise that the processing technique of other film layers remains unchanged, the blue pixel emission layer 202 is fabricated with the universal mask plate. Compared with the elaborate mask plate, the universal mask plate is cheaper, easy to keep clean, and hard to deform in operation, thereby reducing equipment expenditure in fabricating the emission layers and the complexities of technology.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An organic electroluminescent device, comprising:
   a substrate, configured to be an anode of the device;
   a blue pixel emission layer, arranged on a surface of the substrate;

a red pixel emission layer and a green pixel emission layer, both being arranged on a surface of the blue pixel emission layer away from the substrate, wherein the blue pixel emission layer is entirely arranged between the substrate and each of the red pixel emission layer and the green pixel emission layer; wherein the red pixel emission layer and the green pixel emission layer are on the same plane, the blue pixel emission layer comprises an effective emission area and a non-effective emission area; and the red pixel emission layer and the green pixel emission layer are arranged on the non-effective emission area;

wherein, an edge of the red pixel emission layer is separated from an edge of the green pixel emission layer such that the red pixel emission layer is not adjacent to the green pixel emission layer;

wherein, either the red pixel emission layer or the green pixel emission layer does not emit light while the effective emission area of the blue pixel emission layer emits light.

2. The device of claim 1, wherein material for the blue pixel emission layer comprises body material and a doping; the body material is configured to transport holes; the doping comprises a chemical compound with a blue emission radical group.

3. The device of claim 2, wherein body material and the doping form a single layer.

4. The device of claim 1, further comprising:

a red pixel adjustment layer, arranged between the blue pixel emission layer and the red pixel emission layer and configured to transport a hole and block electron transport;

a green pixel adjustment layer, arranged between the blue pixel emission layer and the green pixel emission layer and configured to transport a hole and block electron transport.

5. The device of claim 4, wherein the area of the red pixel adjustment layer is the same as the area of the red pixel emission layer; the area of the green pixel adjustment layer is the same as the area of the green pixel emission layer.

6. The device of claim 4, wherein the red pixel adjustment layer is in direct contact with the blue pixel emission layer, and the green pixel adjustment layer is in direct contact with the blue pixel emission layer.

7. The device of claim 1, wherein both the red pixel emission layer and the green pixel emission layer are in contact with one metallic cathode layer by an electron transport layer.

8. The device of claim 7, wherein both the metallic cathode layer and electron transport layer are flat plates.

9. The device of claim 1, wherein the organic electroluminescent device comprises only one blue pixel emission layer.

10. The device of claim 1, wherein a portion of the blue pixel emission layer being the farthest away from the substrate is not farther to the substrate than each of a surface of the red pixel emission layer facing the substrate and a surface of the green pixel emission layer facing the substrate.

11. The device of claim 1, wherein the blue pixel emission layer is a flat plate.

12. The device according to claim 1, wherein, both the red pixel emission layer and the green pixel emission layer do not emit light while the effective emission area of the blue pixel emission layer emits light.

13. The device according to claim 1, wherein, the blue pixel emission layer below the red pixel emission layer does not emit light when the red pixel emission layer is lit up.

14. The device according to claim 1, wherein, the blue pixel emission layer below the green pixel emission layer does not emit light when the green pixel emission layer is lit up.

* * * * *